(12) United States Patent
Takeuchi et al.

(10) Patent No.: US 6,549,437 B1
(45) Date of Patent: Apr. 15, 2003

(54) VOLTAGE CONVERTER

(75) Inventors: Yukihisa Takeuchi, Aichi-ken; Iwao Ohwada, Nagoya, both of (JP)

(73) Assignee: NGK Insulators, Ltd., Nagoya (JP)

( * ) Notice: Subject to any disclaimer, the term of this patent is extended or adjusted under 35 U.S.C. 154(b) by 284 days.

(21) Appl. No.: 09/635,753

(22) Filed: Aug. 10, 2000

(30) Foreign Application Priority Data

Aug. 16, 1999 (JP) .......................................... 11-229971
Jul. 26, 2000 (JP) ....................................... 2000-225946

(51) Int. Cl.[7] ................................................ H02M 3/18
(52) U.S. Cl. ......................................... 363/59; 361/207
(58) Field of Search ...................... 363/59, 60; 361/207

(56) References Cited

U.S. PATENT DOCUMENTS 5,288,053 A * 2/1994 Fowler ....................... 219/506

FOREIGN PATENT DOCUMENTS

JP          11-339561          12/1999

* cited by examiner

Primary Examiner—Shawn Riley
(74) Attorney, Agent, or Firm—Burr & Brown

(57) ABSTRACT

Two sets of two relay switches, which charge a pump capacitor and a reservoir capacitor of a charge pump type voltage converter, are formed respectively by a set of plural piezo-electric relays, and both the capacitors are formed together with the piezo-electric relays on one substrate. Electrodes are provided respectively on both surfaced of a piezo-electric film, and operating sections are operated by applying a power-supply voltage thereto, and a movable terminal is brought into contact with a counter terminal plate due to deformation of the operating section so that the piezo-electric relays are turned on.

126 Claims, 11 Drawing Sheets

FIG. 1
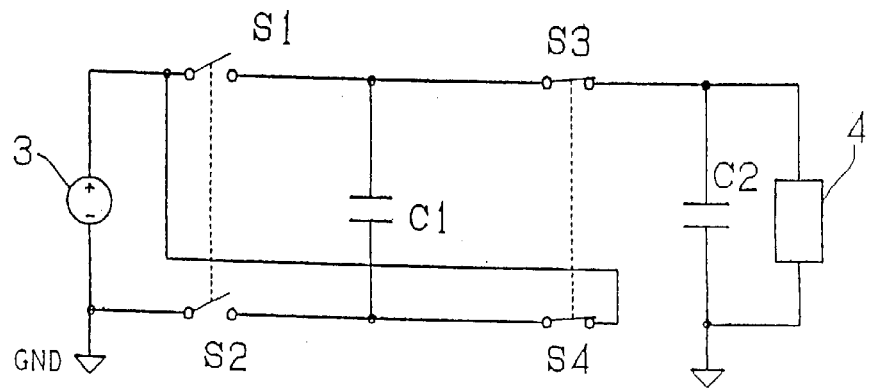
FIG. 2
(a)
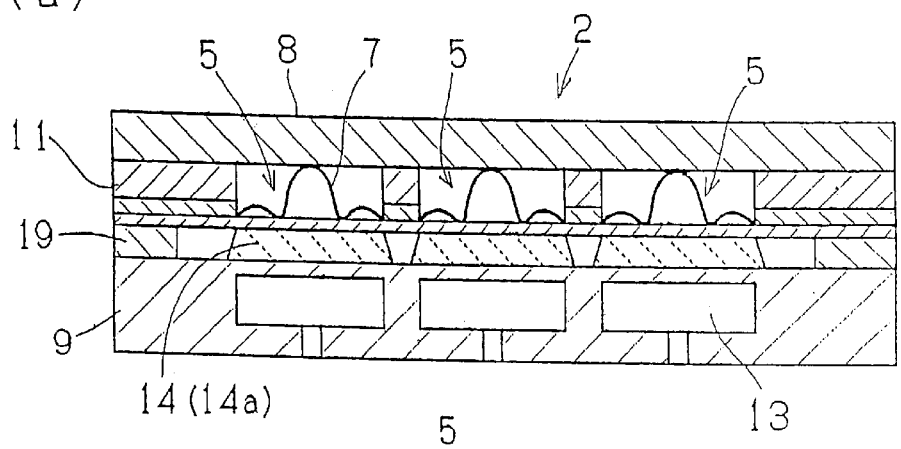
(b)
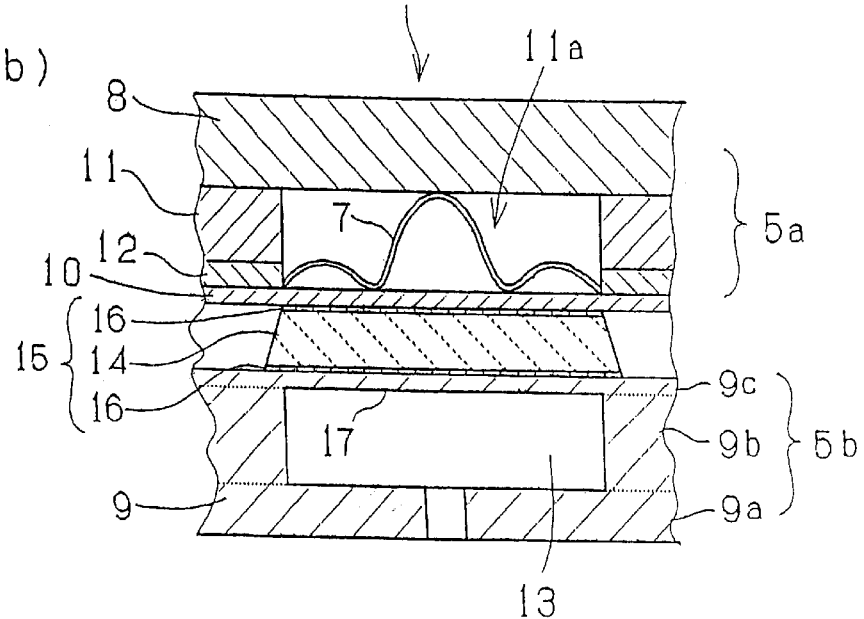

FIG. 13 - Prior Art
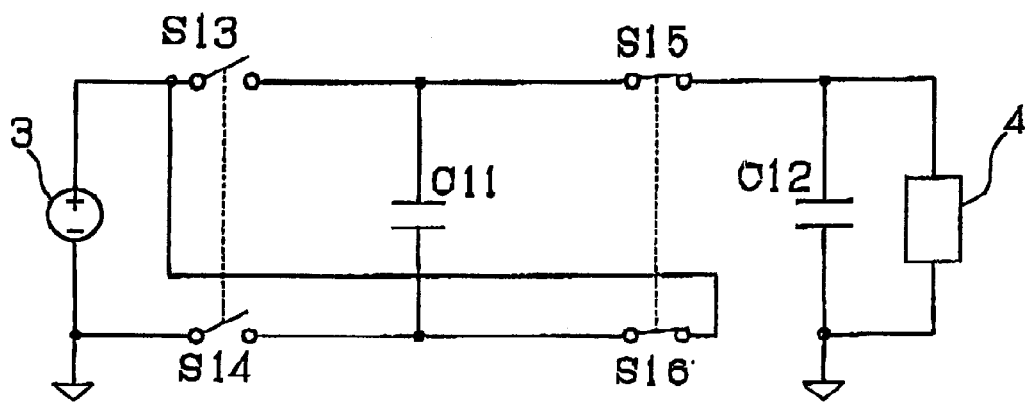
FIG. 14 - Prior Art
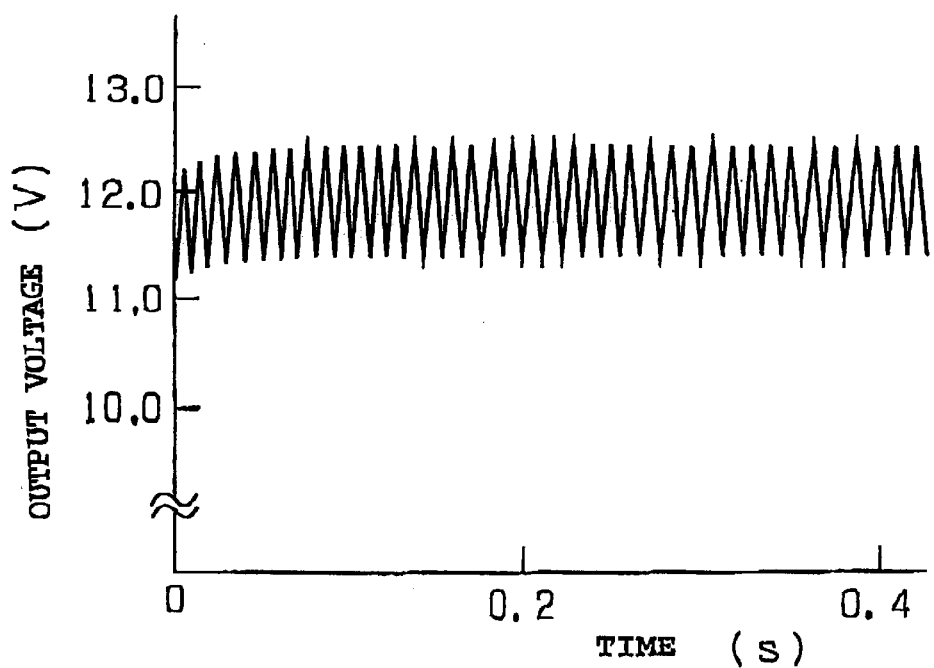

FIG. 15
(a)
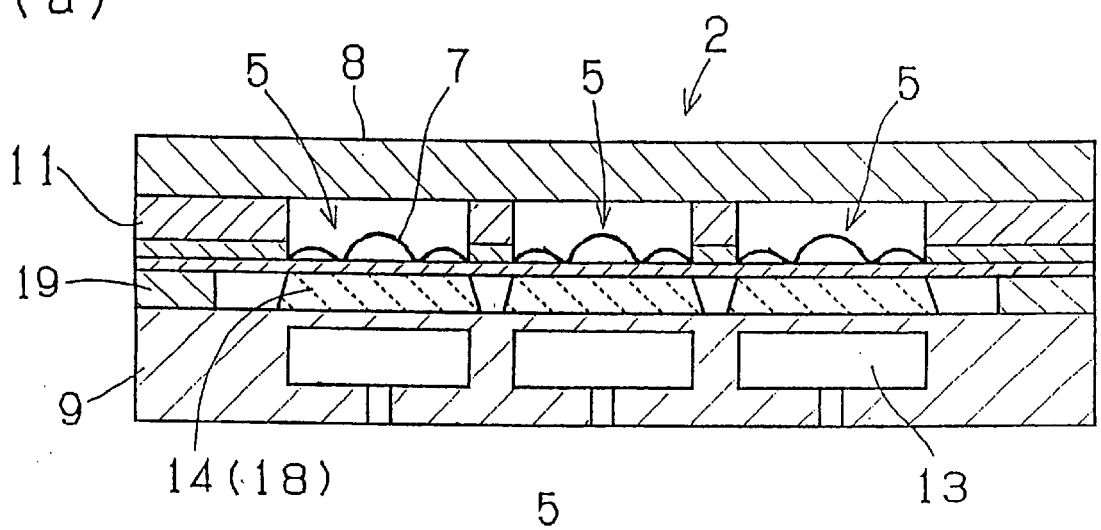
(b)
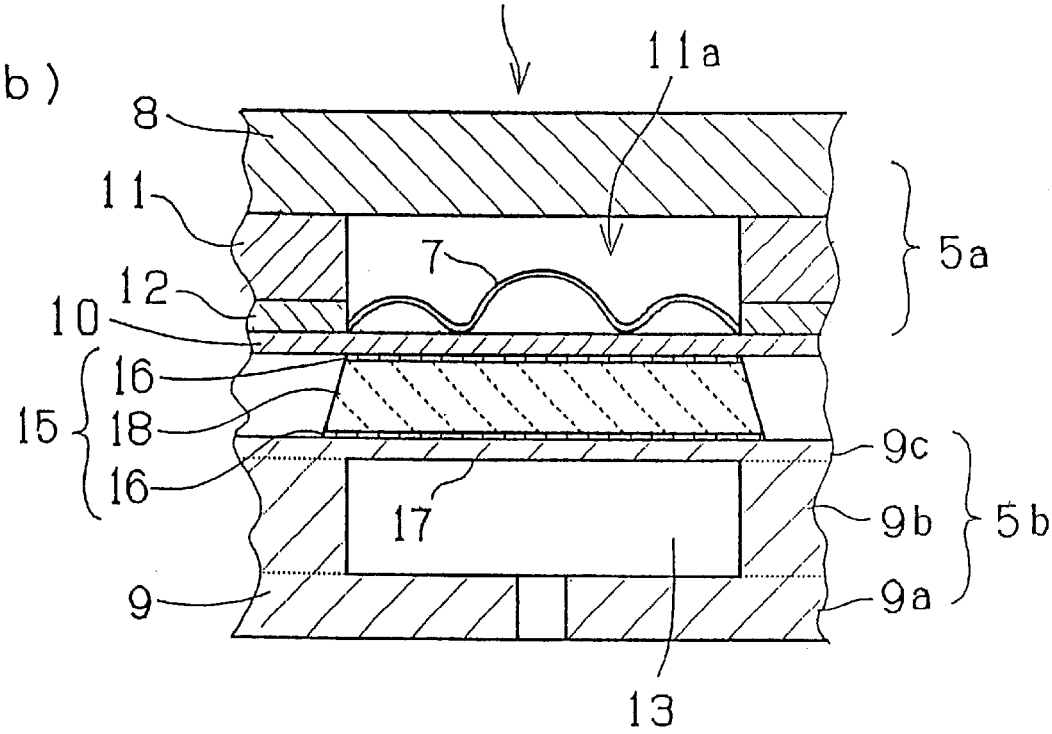

VOLTAGE CONVERTER

FIELD OF THE INVENTION

The present invention relates to a voltage converter. More specifically, the invention relates to improvement of a charge pump type voltage converter.

RELATED ART

Voltage converters include chopper type switching system, fly-back converter, forward converter, charge pump type converter and the like, and they are used properly according to applications. FIG. 13 shows a charge pump type 1-step-up converter. As shown in the drawing, two sets of relay switches S13 and S14 and relay switches S15 and S16 which interlock, two capacitors C11 and C12 are provided between a power supply 3 and an output terminal. C11 is a pump capacitor, and C12 is a reservoir capacitor. The two sets of relay switches are turned on/off alternatively so that the pump capacitor C11 and the reservoir capacitor C12 are charged alternatively and performs a step-up operation.

For example, when the power supply 3 is set to DC 12 V, a load 4 is set to 100Ω, SSR (solid state relay) or MOS relay is used as a relay and an operation speed is 0.1 ms, an output voltage characteristic is as shown in FIG. 14. Here, in FIG. 14, the pump capacitor is set to 100 μF. and reservoir capacitor is set to 100 μF.

When the voltage converters are compared with each other, a chopper switching type voltage converter requires a coil, and a fly-back converter or a forward converter requires a transformer. For this reason, these converters are not convenient for the case where they are miniaturized, and become expensive. Moreover, their circuit configuration is complicated, and an adjustment operation is troublesome.

In addition, as for a charge pump type voltage converter, as shown in FIG. 13, coil and transformer are not required so that its circuit can be configured at low price, but it is difficult for this converter to cope with high load (high output current). As shown in FIG. 14, in the case where a 12 V power supply is raised by 1 step so that a load of about 4 W is driven, the output voltage cannot obtain a satisfactory step-up value so as to become unstable. As a result, the output voltage cannot cope with the load.

This is because a switching speed and on-resistance of SSR or MOS relay do not obtain satisfactory values. Even if the SSR or MOS relay is changed into a MOS analog switch, for example, high-speed switching is possible but the on-resistance is large. As a result, the above problem cannot be solved. Moreover, on-resistance of a mechanical relay is small but high-speed switching is impossible so that the problem cannot be solved.

SUMMARY OF THE INVENTION

In order to solve the above problem, the inventors pay attention to that if on-resistance is small and high-speed operation can be performed in a relay to be used for a charge pump type voltage converter, the above problem is solved and a voltage converter of small size, high output, high voltage and high efficiency can be realized at low price. Therefore, an object of the present invention is to provide a voltage converter which has small size, high output, high voltage and high efficiency although this voltage converter is of a charge pump type.

In order to solve the above problem, a first aspect of the invention provides a charge pump type voltage converter having a pump capacitor, a reservoir capacitor and a plurality of switch elements, characterized in that the switch elements are composed of piezo-electric relays, and actuator sections of the piezo-electric relay have a shape holding layer, an operating section having at least a pair of electrodes formed on the shape holding layer, a vibration section for supporting the operating section and a fixing section for supporting the vibration section vibratingly, and the vibration section and the fixing section are formed integrally by ceramic, and the shape holding layer is composed of a piezo-electric and/or electrostrictive layer and/or an anti-ferroelectric layer.

A second aspect of the invention provides the voltage converter depending from the first aspect, characterized in that the switch elements and the pump capacitor and/or the reservoir capacitor are formed integrally on one substrate.

A third aspect of the invention provides the voltage converter depending from the first or second aspect, characterized in that contact points of the piezo-electric relays are composed of a movable terminal which moves up and down due to deformation of the operating section and a counter terminal plate which faces an upper surface of the movable terminal.

A fourth aspect of the invention provides the voltage converter depending from the first, second or third aspect, characterized in that one switch element is composed of a plurality of piezo-electric relays, and when the piezo-electric relays perform on/off operations simultaneously, the switch elements are opened and closed.

A fifth aspect of the invention provides the voltage converter depending from the first through fourth aspects, characterized by including the piezo-electric relays which can be driven by an input voltage, A sixth aspect of the invention provides the voltage converter depending from the fifth aspect, characterized in that a groove is provided on the substrate between adjacent operating actions.

A seventh aspect of the invention provides the voltage converter depending from the fifth or sixth aspect, characterized in that the voltage converter is of a step-up type that a DC voltage on the output aside is larger than an input voltage.

An eight aspect of the invention provides the voltage converter depending from the first through seventh aspects, characterized by including a sub-power supply section having the piezo-electric relays which can be driven by the input voltage and a main power supply section having the piezo-electric relays which can be driven by the output voltage.

A ninth aspect of the invention provides the voltage converter depending from the eighth aspect, characterized in that the sub-power supply section is first operated so as to generate a raised output voltage, and the main power supply section starts to operate.

A tenth aspect of the invention provides the voltage converter depending from the ninth aspect, characterized in that detection means for detecting the start of operation of the main power supply section is provided to the sub-power supply section, and the sub-power supply section is provided with stopping means for receiving a detection signal from the detection means so as to stop the driving An eleventh aspect of the invention provides the voltage converter depending from the tenth aspect, characterized in that the stopping means is composed of the piezo-electric relay which is driven by the raised output voltage of the main power supply section.

BRIEF DESCRIPTION OF THE DRAWINGS

FIG. 1 is a circuit diagram showing a charge pump type voltage converter according to a first embodiment of the present invention.

FIG. 2 are explanatory diagrams showing switch elements composed of piezo-electric relays in FIG. 1:

FIG. 2(a) is a cross section; and

FIG. 2(b) is a partially enlarged diagram or FIG. (2).

FIG. 13 is a circuit diagram showing a conventional charge pump type voltage converter.

FIG. 14 is a diagram showing an output voltage characteristic or FIG. 13.

FIG. 15 are explanatory diagrams showing another examples of the switch elements composed of the piezo-electric relays of FIG. 1 when the anti-ferroelectric film is used:

FIG. 15(a) is a cross section,: and

FIG. 15(b) is a partially enlarged diagram.

There will be detailed below embodiments of the present invention with reference to the drawings. FIG. 1 is a circuit diagram showing a voltage converter according to a first embodiment of the present invention. In this voltage converter, one act of a pump capacitor C1 of 100 $\mu$F and a reservoir capacitor c2 of 1000 $\mu$F is provided so that a charge pump type step-up circuit which raises a voltage of a power supply 3 by 1 step is formed. Two sets of relay switches (totally four relay switches) S1, S2, S3 and S4 are composed of switch elements 2 formed with a plurality of piezo-electric relays 5 respectively.

DETAILED DESCRIPTION OF THE INVENTION

Figure 3:
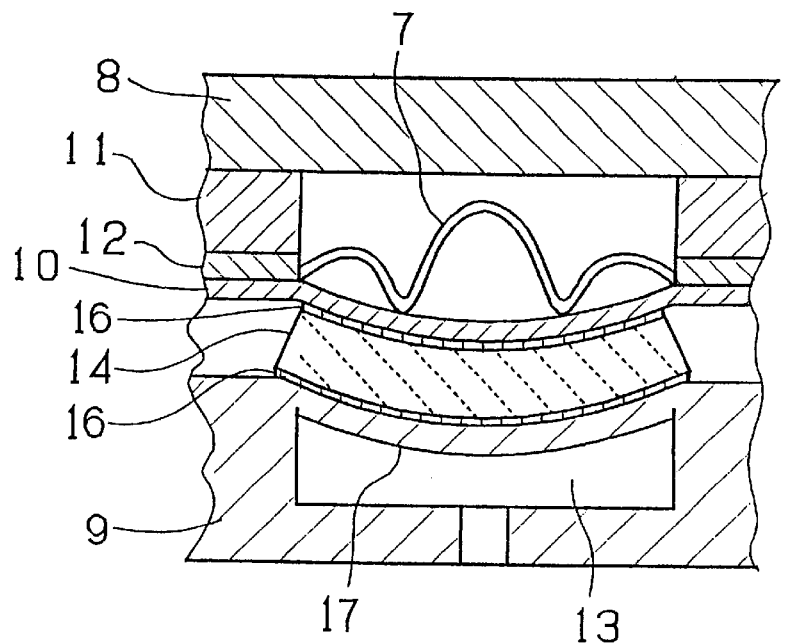
FIG. 3 is a cross section explaining operating state of FIG. 2.

The piezo-electric relay 5 has a structure, for example, shown in the cross section in FIG. 2 of the switch element 2, and it is composed of an upper contact point section 5a and a lower actuator section 5b. The contact point section 5a is constituted so that a counter terminal plate 8 forming one terminal in provided uniformly on an upper portion of the drawing and a plurality of the other terminal plates, which are movable terminals composed of plate springs 7 supported and connected to a metal plate 12, are provided so as to face a lower surface of the counter terminal plate 8.

The metal plate 12 is laminated thin on a rear surface of a substrate 11 which is uniformly aligned on a lower portion of the counter terminal plate 8, or is formed as a metallic film pattern. The metal plate 12 has a plurality of openings 11a which are formed so as to be continuous with the substrate, and the plate springs 7 are provided respectively in the opening 11a. The plate spring 7 is made of, for example, very thin beryllium copper plate having a section whose center portion is protruded upward in the drawing. Moreover, the plate spring 7 is formed into, for example, a circular or an oval shape which in substantially the same as a shape of an operating section 15. The plate spring 7 blocks the opening 11a and closely contacts with the metal plate 12.

The counter terminal plate 8 may be a metal plate, but it may be patterned in such a manner that a metal film is vacuum-evaporated on a lower surface of a transparent glass plate or the like. Moreover, 19 is a side wall made of a ceramic member.

The actuator 5b is constituted so that the operating section 15 which brings the contact point section 5a into the on/off state is provided on lower portions of the plate springs 7 via an insulating sheet 10, and the operating section 15 is formed on an upper surface of a substrate 9 as a fixing section made of ceramic. The substrate 9 has spaces 13 in positions corresponding to the switch elements respectively, and upper portions of the substrate 9 where the spaces 13 are formed are formed to be thin, and the other portions are thick. The thin portions are easily vibrated by external stress and serve an vibration sections 17. The portions other than the spaces which are thick serve as fixing sections which support the vibration sections.

For this reason, the substrate 9 may be formed as a three-laminated body composed of a bottom layer 9a, a spacer layer 9b as an interface layer and a thin plate layer 9c as a top layer. As for ceramic as a material, particularly a material mainly containing zirconium oxide, a material mainly containing aluminum oxide, or a material mainly containing mixture of them is suitable. Moreover, the spacer layer 9b can be formed by a method such as a screen printing method. The whole substrate 9 may be formed by integral simultaneous firing, junction-integrating the respective layers using glass or resin, or post-laminating.

The substrate 9 may be four or more-layered structure.

The operating section 15 is formed in such a manner that a pair of driving electrodes 16 are provided respectively on upper and lower surfaces of a shape holding layer 14 composed of a piezo-electric film 14a. The shape holding layer 14 can be formed by a piezo-electric/electrostrictive layer, an anti-ferroelectric layer or a mixture of them. In the case of the piezo-electrics/electrostrictive layer, a material which mainly contains lead zircon (PMN series), a material mainly containing lead nickel niobium (PNN series), a material mainly containing lead zinc niobium, a material mainly containing lead manganese niobium, a material mainly containing lead magnesium tantalum, a material mainly containing lead nickel tantalum, a material mainly containing lead antimony tin, a material mainly containing lead titanium, a material mainly containing lead magnesium tungsten, a material mainly containing lead cobalt niobium, or a composite material containing some combinations of them can be used. However, in all the ceramics, the ceramic containing lead zircon is used as the piezo-electric/ electrostrictive layer the most, frequently.

In addition, the switch element 2 in which the shape holding layer 14 in formed by an anti-ferroelectric film 18 is formed as shown in the cross section of FIG. 15 and its basic structure can be similar to that of FIG. 2. In the case where the anti-ferroelectric film 18 is used, a material mainly containing lead zircon, a material mainly containing a component composed of lead zircon and load tin, a material obtained by adding lanthanum oxide to lead zircon, or a material obtained by adding lead zircon or lead niobium to the component composed of lead zircon and lead tin is desirable. Particularly in the case of driving at low voltage, the anti-ferroelectric film containing the component composed of lead zircon and lead tin is preferably used.

In order to form the shape holding layer 14, the above materials are changed into paste or slurry so as to be suitably subject to various thick film forming methods much as screen-printing, spray, coating, dipping, application and electrophoresis method. Particularly, the screen printing method is preferably used because fine printing can be executed at low price.

The driving electrodes 16 of the shape holding layer 14 may be made of any material as long as the material is conductor which withstands high-temperature oxide atmosphere. For example, metallic elemental substance or alloy is desirable, but high-melting noble metal much as platinum, palladium and rhodium, a material mainly containing alloy such as silver-palladium, silver-platinum, platinum-palladium, or a cermet material of platinum and a substrate material such as piezo-electric/electrostrictive material is suitable.

The pair of driving electrodes 16 can be formed by the above electrode materials according to the above-mentioned thick film forming method or a normal thin film forming method, namely such an sputtering, ion-beam, vacuum evaporation, ion-plating, CVD, and plating. However, the lower electrode is formed preferably according to screen-printing, spray, dipping, application, electrophoresis method or the like. The upper electrode is formed preferably according to the same thick film forming method as well as the thin film forming method.

It is preferable that the driving electrodes are constituted so that a pair of them are formed on upper and lower surfaces of the shape holding layer, but they can be formed only on the upper or lower surface of the shape holding layer so as to face each other like the teeth of a comb.

There will be explained below an operation of the piezo-electric relay 5, When a voltage which is the same an an applied voltage at the time of polarizing the piezo-electric film 14a is applied between the driving electrodes 16 formed on the upper and lower sides of the piezo-electric film 14a, electrolysis causing distortion occurs and due to its lateral effect, the piezo-electric film 14a is bent and shifted downward. FIG. 3 shows the shifted state. When the piezo-electric film 14a shifted downward, the plate spring 7 in pulled down and is separated from the counter terminal plate 8 which contacts with the plate spring 7 when a voltage is not applied so that the switching operation is performed.

In the case where a diameter of the piezo-electric film 14a is about 100 μm, for example, a contact area between the plate spring 7 and the counter terminal plate 8 is very small. However, a lot of contact portions are formed in such a manner that one set of ten piezo-electric relays 14a, for example, form the switch element 2 so that a large electric current can passed. Moreover, since the respective piezo-electric relays 14a can utilize a small-sized actuator having high rigidity, while high-frequency and high-integration of switching are maintained, a high-speed switch which makes on/off of the large electric current possible can be obtained.

In such a manner, one switch element 2 is formed by a plurality of piezo-electric relays, and the switch element 2 is utilized for the respective relay switches of the charge pump type voltage converter. An a result, the input voltage is raised so as to be output.

Figure 16:
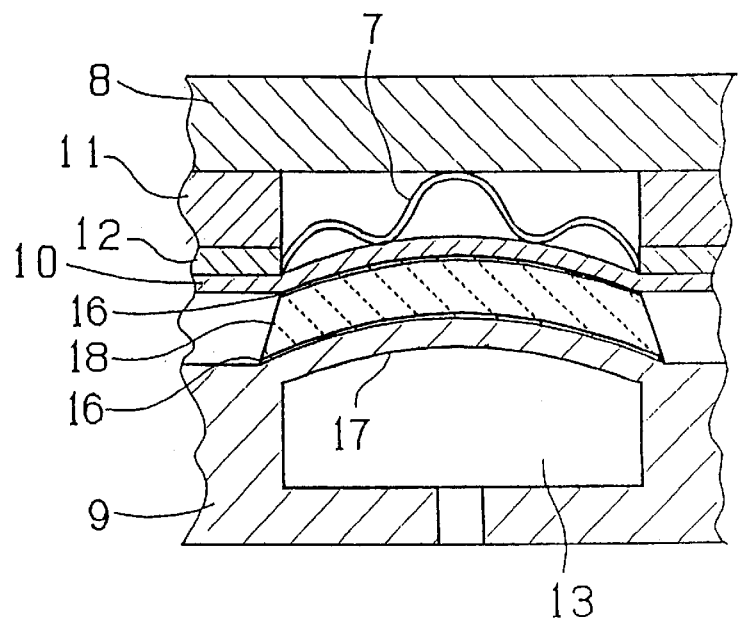
FIG. 16 is a cross section explaining FIG. 15 at the time of operation.

The switching operation of the relay switch may be performed by using a microcomputer. Moreover, in the case where the operating section 15 is composed of not the piezo-electric film but an electrostrictive layer film or an anti-ferroelectric film, polarity of the applied voltage may be positive or negative, but in the case of the anti-ferroelectric film, an effect at the time of applying a voltage is reversed so that the plate spring 7 is separated from the counter terminal plate 8 as shown in FIG. 15(b) in the state that the voltage in not applied, and they are brought into the state shown in FIG. 16, namely, into the contact state at the time of applying a voltage. However, once the anti-ferroelectric film shifts, even if the applied voltage is set to zero, the shift is maintained. An a result, the applying of the voltage can be stopped after the shifts.

When the switch element is constituted by using such small-sized piezo-electric relays which can perform a high-speed operation, the high-speed switching operation of 1 μs, for example, and low-on resistance can be realized easily. Moreover, when one switch element is composed of a plurality of piezo-electric relays, on-resistance of 0.1Ω, for example, can be realized. As a result, the step-up converter with high output current and high output voltage can be realized easily without using expensive elements such as a coil and a transformer. Further, even if one piezo-electric relay breaks down, the switch elements can perform the switching operation by means or the other piezo-electric relays so that high reliability can be realized.

Figure 4:
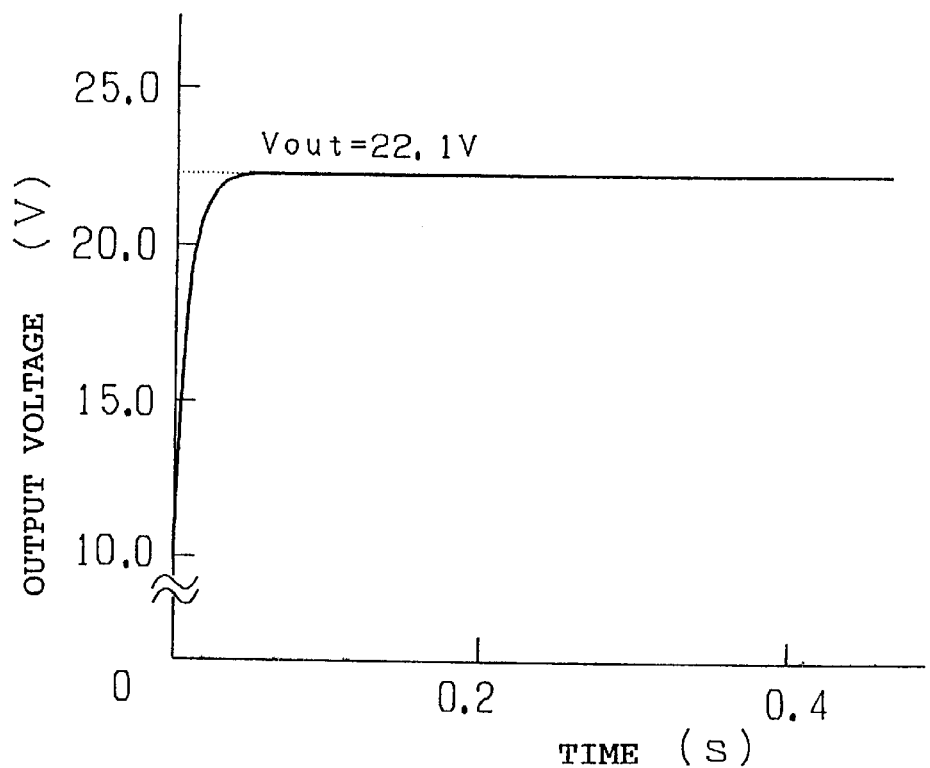
FIG. 4 is a diagram showing an output voltage leading characteristic of FIG. 1.

FIG. 4 depending from the circuit of FIG. 1 shows an output voltage leading characteristic in the case where the power supply voltage is 12 V and the load is 100Ω. The input voltage of 12 V is raised and the stable voltage (about 22 V) is quickly outputted so as to be applied to the load 4. In this case, the voltage converter in which the output is about 4 W is realized. The piezo-electric relays are switched with 1 μs.

In such a manner, the small-sized voltage converter with high output current, high output voltage and high reliability can be realized without using expensive parts such as a coil and a transformer.

Figure 5:
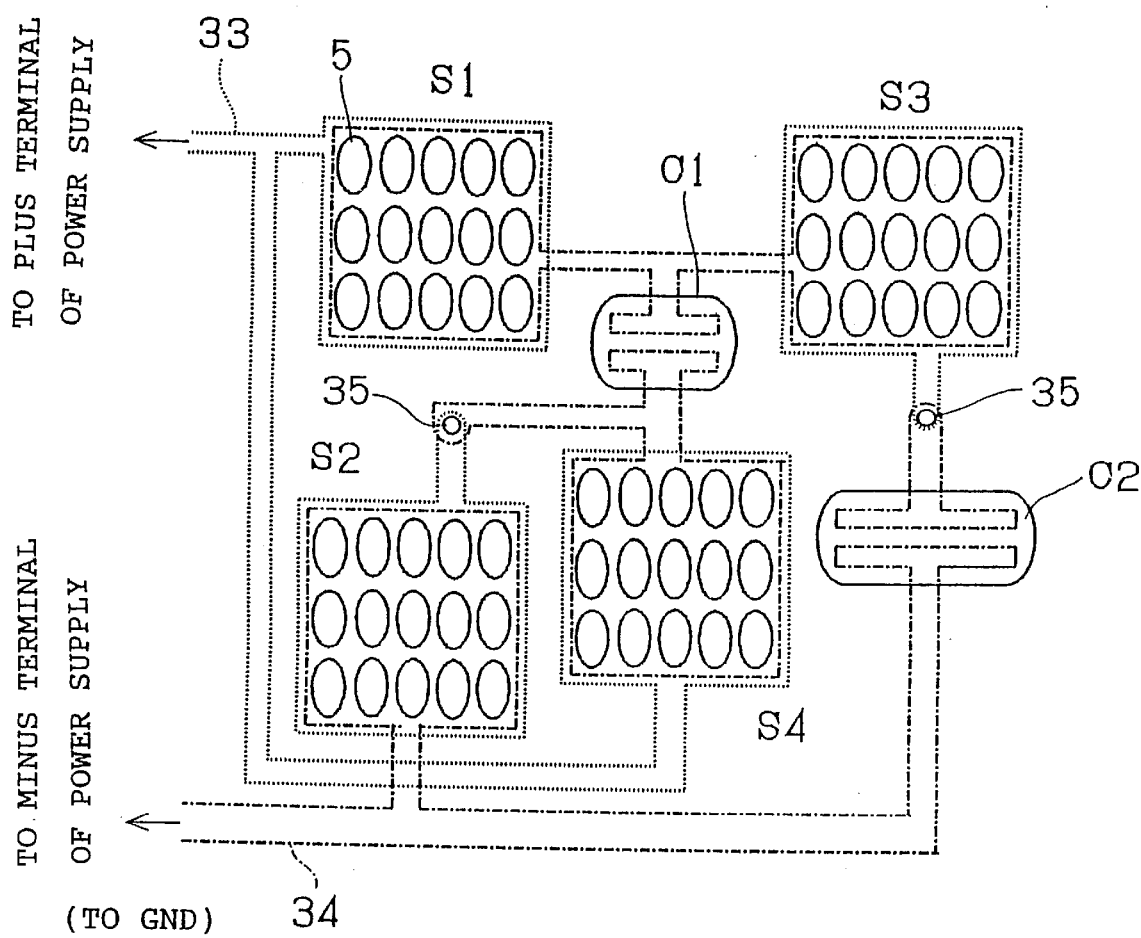
FIG. 5 is a plan view of a charge pump type voltage converter showing that a circuit of FIG. 1 is formed on one substrate.

FIG. 5 is a plane view of the voltage converter, and shows a state that the whole circuit of FIG. 1 is formed on one substrate. A glass plate is used as the counter terminal plate 8, and an electrode is patterned on the rear surface of the counter terminal plate 8. In the drawing, 33 is a conductor pattern which is formed on a lower surface of the glass plate and is connected to the plus side of the power supply. Moreover, 34 shows a wiring pattern on the substrate 11, the switch element 2 is composed of fifteen piezo-electric relays 5 having a section of FIG. 2. 35 in a conductive spacer which connects the conductor pattern 33 and the wiring pattern 34. The capacitors C1 and C2 have the shape shown in FIG. 6 so as to be capable or being formed on the substrate where the piezo-electric relay 5 is formed.

Figure 6:
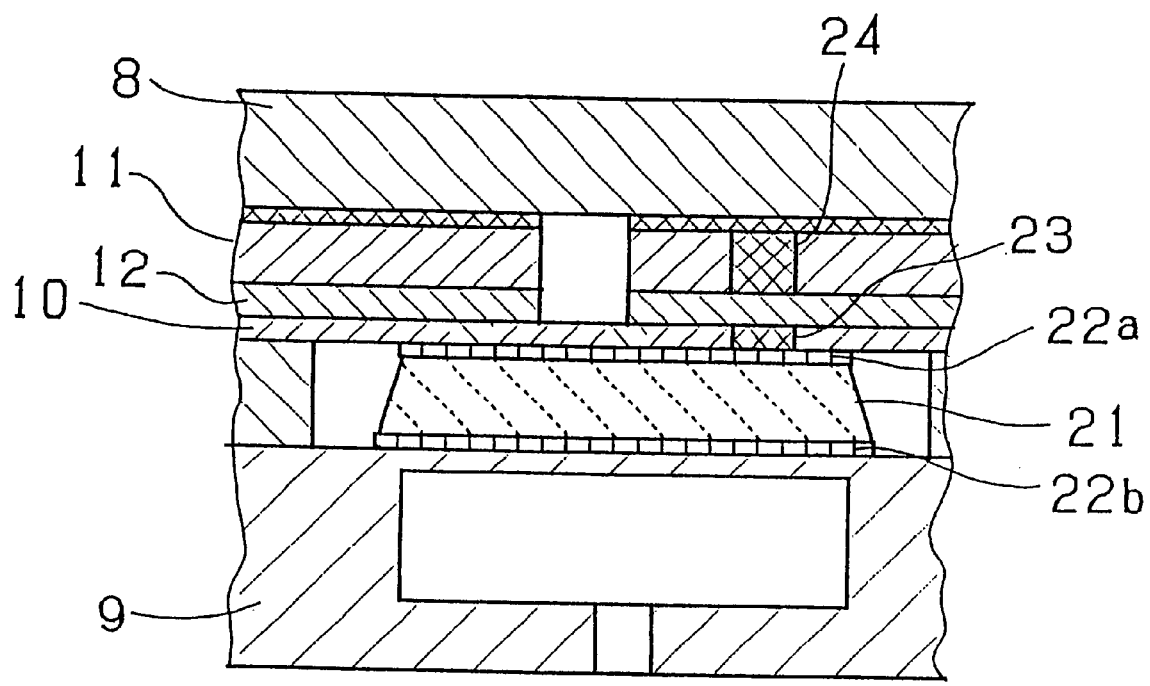
FIG. 6 is a schematic cross section of a capacitor in FIG. 5.

FIG. 6 is an explanatory diagram showing a section of the capacitors formed integrally with the piezo-electric relays. One electrode surface 22a of the capacitor is formed on the upper surface of the piezo-electric film 21, and the other electrode surface 22b is formed on the lower surface. The upper electrode surface 22a is connected with the metal plate 12 via a through hole 23 formed in the insulating sheet 10, and is connected with the conductor pattern 33 formed on the glass plate or the like via a through hole 24 formed in the substrate 11.

In such a manner, the switch element 2 is composed of the piezo-electric relays so that the pump capacitor C1 and the reservoir capacitor C2 can be formed integrally with the piezo-electric relay. As a result, the whole voltage converter can be miniaturized. Further, the built-in element does not require a capacitor so that the price is lowered and the production steps can be simplified.

Figure 7:
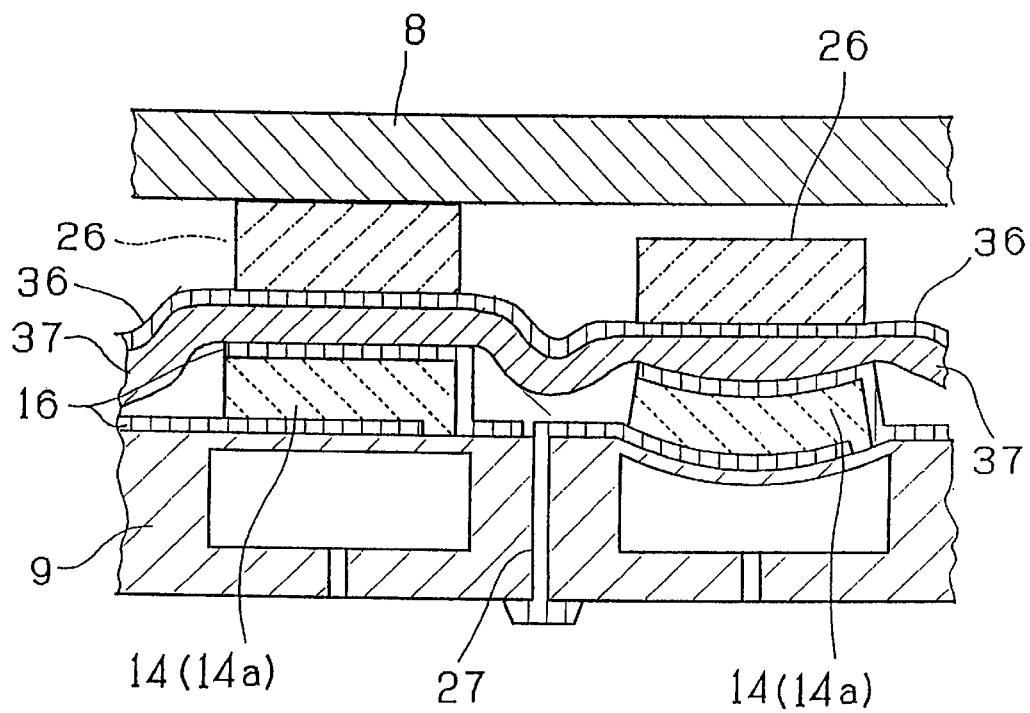
FIG. 7 is a cross section showing another structure of the piezo-electric relay.
Figure 8:
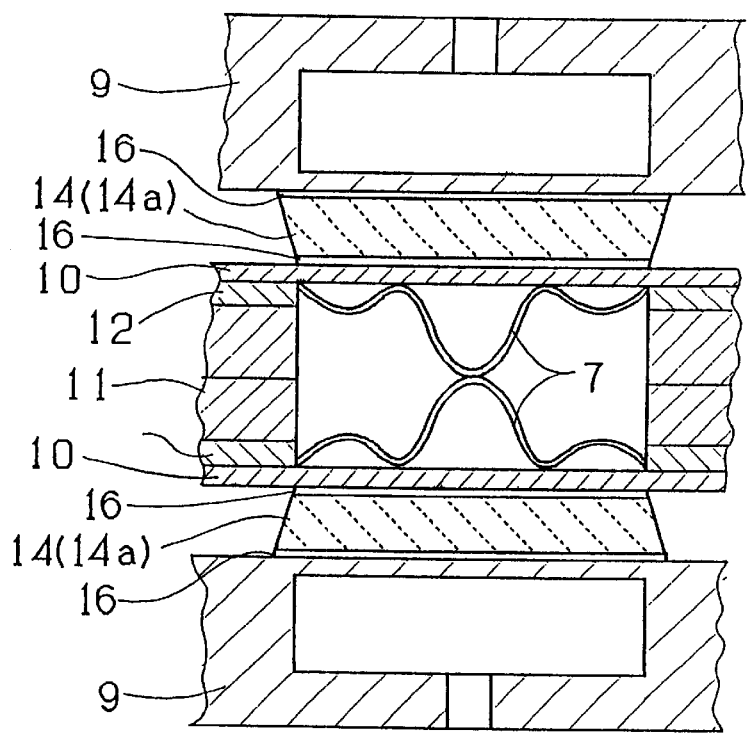
FIG. 8 is a cross section showing another structure of the piezo-electric relay.
Figure 9:
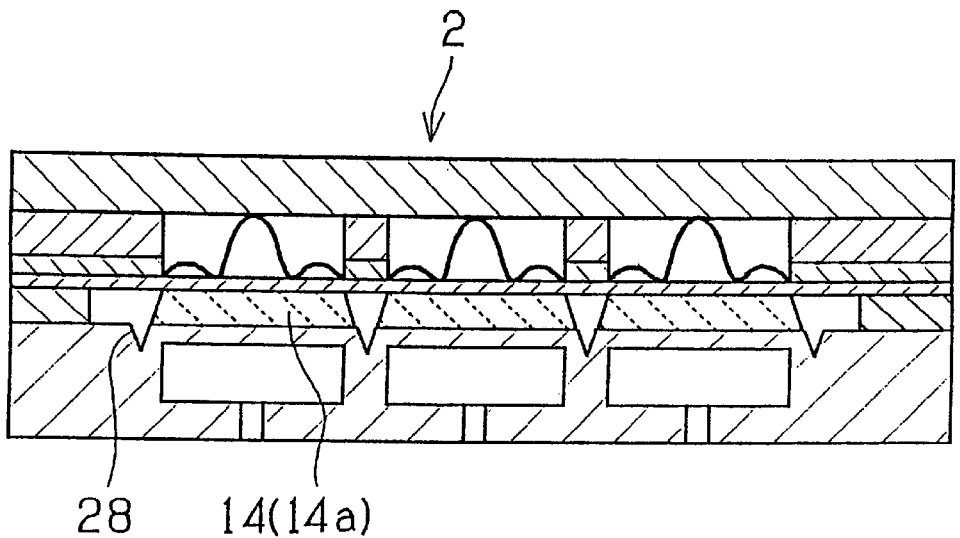
FIG. 9 is a cross section showing another structure of the switch elements.

FIGS. 7 and 8 show another structures of the piezo-electric relay, and FIG. 9 shows another structure of the switch element. In FIG. 7, the other terminal of the contact point section, namely, the movable terminal has a shape different from FIG. 2, and in this embodiment, the movable terminal is formed as a plate body 26 which moves up and down due to deformation of the piezo-electric film 14a. The left side of FIG. 7 shows an on-state, and the right site shows an off-state. Moreover, 27 is a through hole, and an internal conductor is drawn from the substrate 9 via the through hole as the need arises.

When the movable terminal is formed so as to wholly move and surface-contact with the counter terminal plate, the on-resistance can be lowered securely. Moreover, the current capacity can be enlarged, and high reliability can be obtained. The insulating substrate is omitted.

In FIG. 8, the counter terminal plate is also composed of the plate spring 7, and it is a movable terminal. In the case where only the piezo-electric relays are formed, both the terminals can be formed as the movable terminals. As a result, the distance between the contact points can be enlarged, and the contact points of high withstand voltage can be formed.

In FIG. 9, the basic structure is the same as that of FIG. 2, but grooves 28 having a V-shaped section are formed on the substrate respectively between the piezo-electric relays so as to separate the respective piezo-electric film 14a. As a result interference between the operating sections and element characteristic due to a degree of substrate rigidity can be improved, and the distance between the on/off contact points of the piezo-electric relays can be enlarged. The switch element can cope with the switching of high-withstand voltage and large current load.

Figure 17:
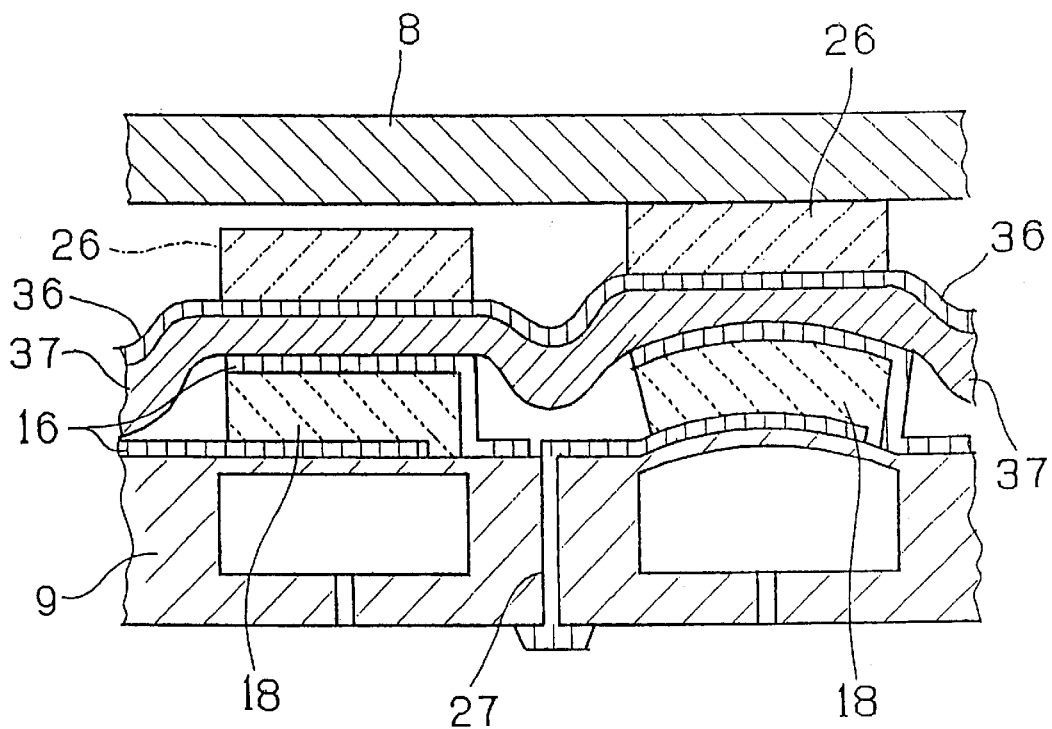
FIG. 17 is a cross section showing another structure of the piezo-electric relays.
Figure 18:
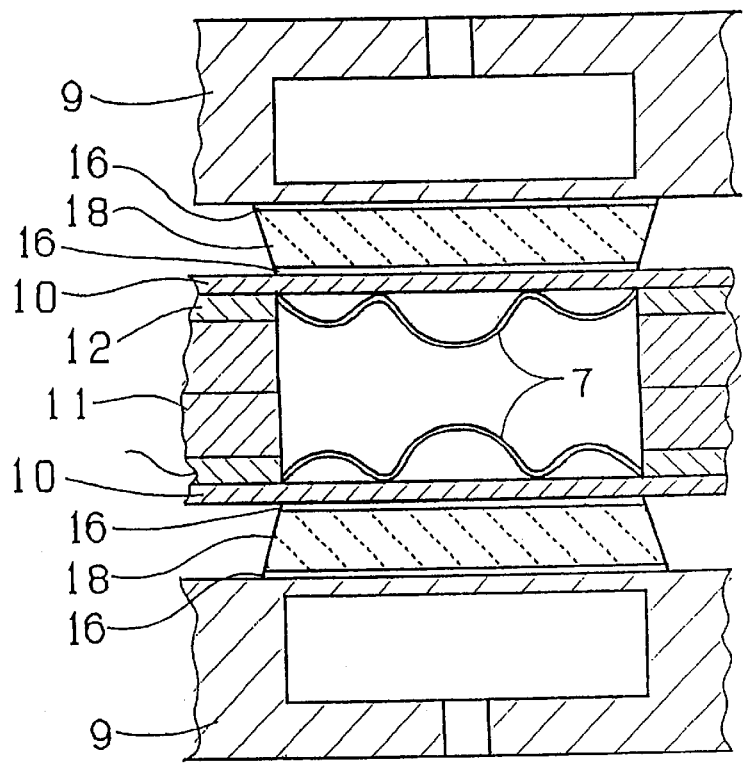
FIG. 18 is a cross section showing another structure of the piezo-electric relays.
Figure 19:
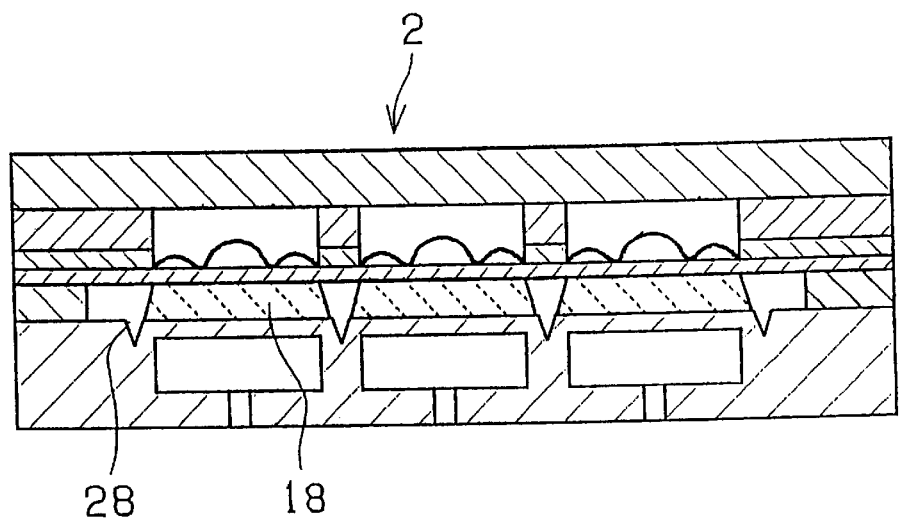
FIG. 19 is cross section showing another structure of the switch elements.

Further, FIGS. 17 through 19 show another structures of the piezo-electric relay or the switch element when the anti-ferroelectric film 8 is used for the shape holding layer. These can be formed in the similar manner by using the anti-ferroelectric film 18 is used as the piezo-electric layer in the structures shown in FIGS. 7 through 9.

Figure 10:
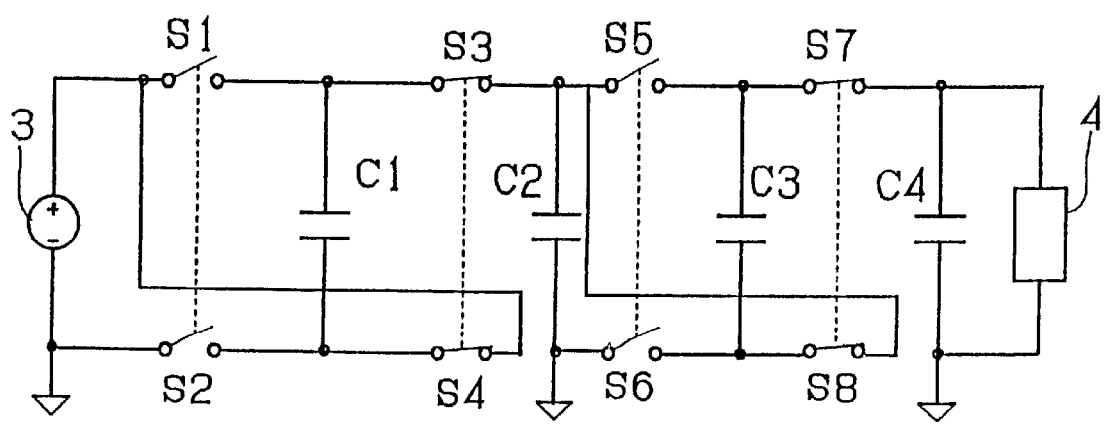
FIG. 10 is a circuit diagram showing a mode that a step-up ratio of the voltage converter of FIG. 1 is changed and thus the charge pump is of two-step.
Figure 11:
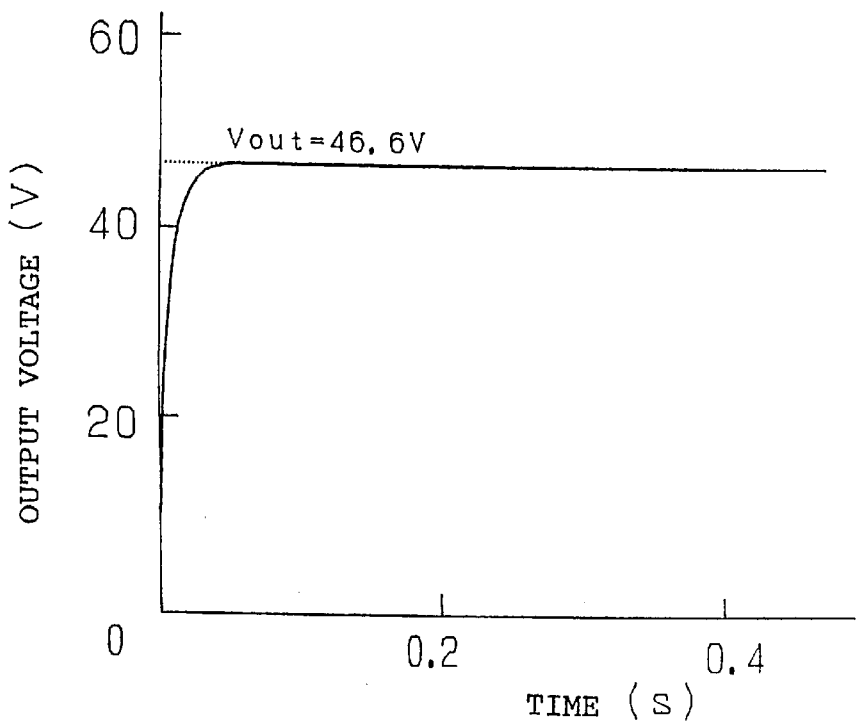
FIG. 11 is a diagram showing an output voltage leading characteristic of FIG. 10.

FIG. 10 is a circuit diagram showing a mode where a step-up ratio of the voltage converter in changed in FIG. 1. Here, a step-up circuit, which is composed of the pump capacitor C3, the reservoir capacitor C4 and a set of the relay switch (S5 through S8), is added to the above-mentioned circuit in a series so that the charge pump type voltage converter in which a voltage is raised by two steps is formed. FIG. 11 shows the output voltage leading characteristic. As shown in the drawing, even if the power supply voltage of 12 V is raised by two steps by the piezo-electric relays 5 and the output voltage becomes not less than 40 V, the stable output voltage can be obtained for the load of 100Ω, and the output of about 20 W can be realized stably.

Figure 12:
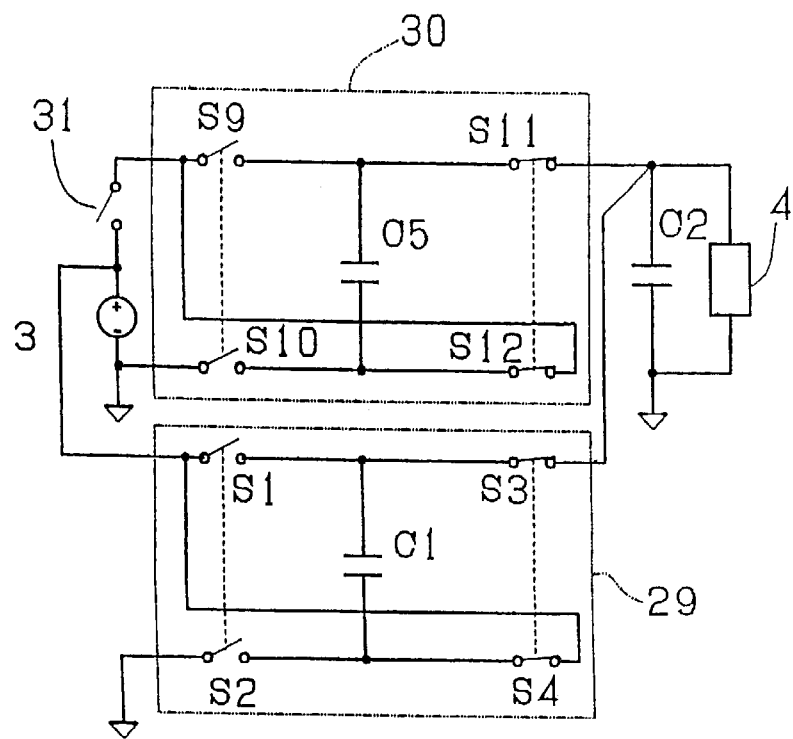
FIG. 12 is a circuit diagram showing the charge pump type voltage converter according to a second embodiment of the present invention.

FIG. 12 is a circuit diagram of the voltage converter according to a second embodiment of the present invention. A one step-up circuit is formed by two sections, namely, by a main power supply section 29, which is composed of a set of relay switches (S1 through S4) and the pump capacitor C1, and a sub-power supply section 30, which is composed of a set of relay switches (S9 through S12) and a pump capacitor C5. The sub-power supply section 30 is provided with a change-over switch 31 as stopping means, and detection means (not shown) for detecting an operation of the main power supply section 29.

The piezo-electric relays of the relay switches used in the sub-power supply section 30 are operated power-supply voltage (for example, 12 V), and the piezo-electric relays used in the main power supply section 29 are operated satisfactorily by raised output voltage (for example, 22 V). Since such a two-part structure enables the piezo-electric relays of the main power supply to be driven by an output voltage which is larger than an input voltage, the actuator, which is required for obtaining a shift amount necessary for on/off of the contact points, can be miniaturized, and as a result this structure contributes to the miniaturization of the whole voltage converter.

There will be explained below the operation of this circuit. The operation is started in the state that the change-over switch 31 is in an ON state so that the s-power supply section 30 is actuated. The piezo-electric relays of the relay switches S9 through S12 in the sub-power supply section 30 are actuated by the power-supply voltage, and the pump capacitor C5 and the reservoir capacitor C2 are charged so that the output voltage is raised. When the output voltage is raised to a predetermined voltage, the main power supply section 29 starts to operate due to the raised voltage. As a result, the detection means detects the operation of the main power supply section 29 and turns off the change-over switch 31 and stops the sub-power supply section 30.

In the detection means the raised output voltage of the main power supply section may be used as a trigger, and the purpose of the piezo-electric relay of the sub-power supply section is to be driven by the input voltage (power-supply voltage), namely, low voltage. For this reason, the piezo-electric relays in which the groove 28 having a V-shaped section shown in FIG. 9 is provided between the relays are preferably used.

When such an operation is performed, the voltage converter can be actuated smoothly, and the piezo-electric relay which operates the pump capacitor C1 of the main power supply section 29 is driven by the raised voltage. For this reason, the high-speed switching operation is possible by a simple circuit configuration without providing another power supply for driving. As a result, the capacitor section can be small, and the whole converter can be further miniaturized.

In addition, the sub-power supply section operates only as a starter circuit, and its operating time is short. For this reason, the sub-power supply section can be operated without reducing the converter efficiency, and its relay structure can be simplified in comparison with the piezo-electric relays of the main power supply section. Further, since the operating time is short, the high reliability can be obtained.

In addition, as for the change-over switch 31, the piezo-electric relay which performs off-operation by applying a voltage thereto may be used so that this piezo-electric relay can be formed on the substrate integrally with the other piezo-electric relays. This contributes to the miniaturization, and even if the sub-power supply section is provided, the production steps do not become complicated. Moreover, as the sub-power supply section, a small-capacity charge pump IC having the conventional structure which is in the market may be used.

Because of the two-section structure of the main power supply section/sub-power supply section, the main power supply section requires high voltage for driving, but the piezo-electric relay which makes the high-speed switching possible can be used, and this contributes to high efficiency.

According to the invention from a first aspect, the piezo-electric relay is used as the switch element so that the switching speed can be heighten and the on-resistance can be reduced. As a result, the compatibility of high current output and high voltage output can be obtained, and the capacitor can be small. Moreover, since the piezo-electric relay can be miniaturized, the whole voltage converter can be formed in a small size.

According to the invention from a second aspect, in addition to the effect of the invention from the first aspect, built-in elements can be reduced and the production steps can be simplified. Moreover, the whole voltage converter can be miniaturized.

According to the invention from a third aspect, in addition to the effect of the invention from the first or second aspect, the contact points of the piezo-electric relays can surface-contact with each other, and the on-resistance is lowered securely and high-reliability can be obtained.

According to the invention from a fourth aspect, in addition to the effect of the invention from the first, second or third aspect, large electric current can be passed so that the invention can cope with the high output current. Therefore, the small-sized voltage converter which has high output current, high output voltage and high reliability can be obtained without using expensive parts such as a coil and a transformer.

In addition, since the capacitor can be smaller, the voltage converter can be further miniaturized by integral firing.

According to the invention from a fifth aspect, in addition to the effects of the invention from the first through fourth aspects, since the piezo-electric relays are driven by the input voltage, another power supply for driving is not required so that the circuit configuration can be simplified.

According to the invention from a sixth aspect, in addition to the effect of the invention from the fifth aspect, since the groove is provided between the operating sections so as to separate the respective operations sections, the element characteristic due to interference between the operating sections and a degree of the substrate rigidity can be improved. Moreover, the distance between the on/off contact points of the piezo-electric relays can be enlarged, and the invention can cope with the switching of high withstand voltage and large current load.

According to the invention from a seventh aspect, in addition to the effect of the invention from the fifth or sixth aspect, the piezoelectric relays are used for the charge pump type switch element so as to be realized easily.

According to the invention from eighth and ninth aspects, in addition to the effects of the invention from the first through seventh aspects, since the piezo-electric relay which is driven by the input voltage and the piezo-electric relay which is driven by the output voltage are provided, the piezo-electric relays can be operated at higher speed so that the high output voltage can be realized effectively. Moreover, the piezo-electric relays of the main power supply and the capacitor can be smaller.

According to the invention from a tenth aspect, in addition to the effect of the invention from the ninth aspect, since the sub-power supply section is operated only as the starter circuit, the operating time is short and it can be operated without lowering the efficiency. Moreover, in the sub-power supply section, the relay structure can be simplified in comparison with the piezo-electric relay of the main power supply section and the operating time can be shorten so that high reliability can be obtained.

According to the invention from an eleventh aspect, in addition to the effect from the tenth aspect, since the stopping means is formed by the piezo-electric relay, it can be formed together with the other piezo-electric relays on one substrate. As a result, even if the sub-power supply section is provided, the production steps do not become complicated, and the structure can be miniaturized.

What is claimed is:

1. A charge pump type voltage converter having a pump capacitor, a reservoir capacitor and a plurality of switch elements, wherein said switch elements are composed of piezo-electric relays, and actuator sections of said piezo-electric relays have a shape holding layer, an operating section having at least a pair of electrodes formed on said shape holding layer, a vibration section for supporting said operating section and a fixing section for supporting said vibration section vibratingly, said vibration section and said fixing section are formed integrally by ceramic, and said shape holding layer is composed of a piezo-electric and/or electrostrictive layer and/or an anti-ferroelectric layer.

2. The voltage converter according to claim 1, wherein said switch elements and said pump capacitor and/or said reservoir capacitor are formed integrally on one substrate.

3. The voltage converter according to claim 1, wherein contact points of said piezo-electric relays are composed of a movable terminal which moves up and down due to deformation of said operating section and a counter terminal plate which faces an upper surface of said movable terminal.

4. The voltage converter according to claim 1, wherein one switch element is composed of a plurality of piezo-electric, relays, and when said piezo-electric relays perform on/off operations simultaneously, the switch elements are opened and closed.

5. The voltage converter according to claim 1, comprising the piezo-electric relays which can be driven by an input voltage.

6. The voltage converter according to claim 5, wherein a groove is provided on the substrate between adjacent operating sections.

7. The voltage converter according to claim 5, which is of a step-up type that a DC voltage on the output side is larger than an input voltage.

8. The voltage converter according to claims 1, comprising a sub-power supply section having the piezo-electric relays which can be driven by the input voltage and a main power supply section having the piezo-electric relays which can be driven by the output voltage.

9. The voltage converter according to claim 8, wherein said sub-power supply section is first operated so as to generate a raised output voltage, and said main power supply section starts to operate.

10. The voltage converter according to claim 9, wherein detection means for detecting the start of operation of said main power supply section is provided to said sub-power supply section, and said sub-power supply section is provided with stopping means for receiving a detection signal from said detection means so as to stop the driving.

11. The voltage converter according to claim 10, wherein said stopping means is composed of the piezo-electric relay which is driven by the raised output voltage of said main power supply section.

12. The voltage converter according to claim 2, wherein contact points of said piezo-electric relays are composed of a movable terminal which moves up and down due to deformation of said operating section and a counter terminal plate which faces an upper surface of said movable terminal.

13. The voltage converter according to claim 12, wherein one switch element is composed of a plurality of piezo-electric relays, and when said piezo-electric relays perform on/off operations simultaneously, the switch elements are opened and closed.

14. The voltage converter according to claim 13, comprising the piezo- electric relays which can be driven by an input voltage.

15. The voltage converter according to claim 13, comprising a sub-power supply section having the piezo-electric relays which can be driven by the input voltage and a main power supply section having the piezo-electric relays which can be driven by the output voltage.

16. The voltage converter according to claim 15, wherein said sub-power supply section is first operated so as to generate a raised output voltage, and said main power supply section starts to operate.

17. The voltage converter according to claim 16, wherein detection means for detecting the start of operation of said main power supply section is provided to said sub-power supply section, and said sub-power supply section is provided with stopping means for receiving a detection signal from said detection means so as to stop the driving.

18. The voltage converter according to claim 17, wherein said stopping means is composed of the piezo-electric relay which is driven by the raised output voltage of said main power supply section.

19. The voltage converter according to claim 14, wherein a groove is provided on the substrate between adjacent operating sections.

20. The voltage converter according to claim 19, which is of a step-up type that a DC voltage on the output side is larger than an input voltage.

21. The voltage converter according to claim 20, comprising a sub-power supply section having the piezo-electric relays which can be driven by the input voltage and a main power supply having the piezo-electric relays which can be driven by the output voltage.

22. The voltage converter according to claim 21, wherein said sub-power supply section is first operated so as to generate a raised output voltage, and said main power supply section starts to operate.

23. The voltage converter according to claim 22, wherein detection means for detecting the start of operation of said main power supply section is provided to said sub-power supply section, and said sub-power supply section is provided with stopping means for receiving a detection signal from said detection means so as to stop the driving.

24. The voltage converter according to claim 23, wherein said stopping means is composed of the piezo-electric relay which is driven by the raised output voltage of said main power supply section.

25. The voltage converter according to claim 19, comprising a sub-power supply section having the piezo-electric relays which can be driven by the input voltage and a main power supply section having the piezo-electric relays which can be driven by the output voltage.

26. The voltage converter according to claim 25, wherein said sub-power supply section is first operated so as to generate a raised output voltage, and said main power supply section starts to operate.

27. The voltage converter according to claim 26, wherein detection means for detecting the start of operation of said main power supply section is provided to said sub-power supply section, and said sub-power supply section is provided with stopping means for receiving a detection signal from said detection means so as to stop the driving.

28. The voltage converter according to claim 27, wherein said stopping means is composed of the piezo-electric relay which is driven by the raised output voltage of said main power supply section.

29. The voltage converter according to claim 14, which is of a step-up type that a DC voltage on the output side is larger than an input voltage.

30. The voltage converter according to claim 29, comprising a sub-power supply section having the piezo-electric relays which can be driven by the input voltage and a main power supply section having the piezo-electric relays which can be driven by the output voltage.

31. The voltage converter according to claim 30, wherein said sub-power supply section is first operated so as to generate a raised output voltage, and said main power supply section starts to operate.

32. The voltage converter according to claim 31, wherein detection means for detecting the start of operation of said main power supply section is provided to said sub-power supply section, and said sub-power supply section is provided with stopping means for receiving a detection signal from said detection means so as to stop the driving.

33. The voltage converter according to claim 32, wherein said stopping means is composed of the piezo-electric relay which is driven by the raised output voltage of said main power supply section.

34. The voltage converter according to claim 14, comprising a sub-power supply section having the piezo-electric relay which can be driven by the input voltage and a main power supply section having the piezo-electric relays which can be driven by the output voltage.

35. The voltage converter according to claim 34, wherein said sub-power supply section is first operated so as to generate a raised output voltage, and said main power supply section starts to operate.

36. The voltage converter according to claim 35, wherein detection means for detecting the start of operation of said main power supply section is provided to said sub-power supply section, and said sub-power supply section is provided with stopping means for receiving a detection signal from said detection means so as to stop the driving.

37. The voltage converter according to claim 36, wherein said stopping means is composed of the piezo-electric relay which is driven by the raised output voltage of said main power supply section.

38. The voltage converter according to claim 12, comprising the piezo-electric relays which can be driven by an input voltage.

39. The voltage converter according to claim 38, wherein a groove is provided on the substrate between adjacent operating sections.

40. The voltage converter according to claim 39, which is of a step-up type that a DC voltage on the output side is larger than an input voltage.

41. The voltage converter according to claim 40, comprising a sub-power supply section having the piezo-electric relays which can be driven by the input voltage and a main power supply section having the piezo-electric relays which can be driven by the output voltage.

42. The voltage converter according to claim 41, wherein said sub-power supply section is first operated so as to generate a raised output voltage, and said main power supply section starts to operate.

43. The voltage converter according to claim 42, wherein detection means for detecting the start of operation of said main power supply section is provided to said sub-power supply section, and said sub-power supply section is provided with stopping means for receiving a detection signal from said detection means so as to stop the driving.

44. The voltage converter according to claim 43, wherein said stopping means is composed of the piezo-electric relay which is driven by the raised output voltage of said main power supply section.

45. The voltage converter according to claim 39, comprising a sub-power supply section having the piezo-electric relays which can be driven by the input voltage and a main power supply section having the piezo-electric relays which can be driven by the output voltage.

46. The voltage converter according to claim 45, wherein said sub-power supply section is first operated so as to generate a raised output voltage, and said main power supply section starts to operate.

47. The voltage converter according to claim 46, wherein detection means for detecting the start of operation of said main power supply section is provided to said sub-power supply section, and said sub-power supply section is provided with stopping means for receiving a detection signal from said detection means so as to stop the driving.

48. The voltage converter according to claim 47, wherein said stopping means is composed of the piezo-electric relay which is driven by the raised output voltage of said main power supply section.

49. The voltage converter according to claim 38, which is of a stop-up type that a DC voltage on the output side is larger than an input voltage.

50. The voltage converter according to claim 49, comprising a sub-power supply section having the piezo-electric relays which can be driven by the input voltage and a main power supply section having the piezo-electric relays which can be driven by the output voltage.

51. The voltage converter according to claim 50, wherein said sub-power supply section is first operated so as to generate a raised output voltage, and said main power supply section starts to operate.

52. The voltage converter according to claim 51, wherein detection means for detecting the start of operation of said main power supply section is provided to said sub-power supply section, and said sub-power supply section is provided with stopping means for receiving a detection signal from said detection means so as to stop the driving.

53. The voltage converter according to claim 52, wherein said stopping means is composed of the piezo-electric relay which is driven by the raised output voltage of said main power supply section.

54. The voltage converter according to claim 12, comprising a sub-power supply section having the piezo-electric relays which can be driven by the input voltage and a main power supply section having the piezo-electric relays which can be driven by the output voltage.

55. The voltage converter according to claim 54, wherein said sub-power supply section is first operated so as to generate a raised output voltage, and said main power supply section starts to operate.

56. The voltage converter according to claim 55, wherein detection means for detecting the start of operation of said main power supply section is provided to said sub-power supply section, and said sub-power supply section is provided with stopping means for receiving a detection signal from said detection means so as to stop the driving.

57. The voltage converter according to claim 56, wherein said stopping means is composed of the piezo-electric relay which is driven by the raised output voltage of said main power supply section.

58. The voltage converter according to claim 38, comprising a sub-power supply section having the piezo-electric relays which can be driven by the input voltage and a main power supply section having the piezo-electric relays which can be driven by the output voltage.

59. The voltage converter according to claim 58, wherein said sub-power supply section is first operated so as to generate a raised output voltage, and said main power supply section starts to operate.

60. The voltage converter according to claim 59, wherein detection means for detecting the start of operation of said main power supply section is provided to said sub-power supply section, and said sub-power section is provided with stopping means for receiving a detection signal from said detection means so as to stop the driving.

61. The voltage converter according to claim 60, wherein said stopping means is composed of the piezo-electric relay which is driven by the raised output voltage of said main power supply section.

62. The voltage converter according to claim 2, wherein one switch element is composed of a plurality of piezo-electric relays, and when said piezo-electric relays perform on/off operations simultaneously, the switch elements are opened and closed.

63. The voltage converter according to claim 62, comprising the piezo-electric relays which can be driven by and input voltage.

64. The voltage converter according to claim 63, wherein a groove is provided on the substrate between adjacent operating sections.

65. The voltage converter according to claim 64, which is of a step-up type that a DC voltage on the output side is larger than an input voltage.

66. The voltage converter according to claim 65, comprising a sub-power supply section having the piezo-electric relays which can be driven by the input voltage and a main power supply section having the piezo-electric relays which can be driven by the output voltage.

67. The voltage converter according to claim 66, wherein said sub-power supply section is first operated so as to generate a raised output voltage, and said main power supply section starts to operate.

68. The voltage converter according to claim 67, wherein detection means for detecting the start of operation of said main power supply section is provided to said sub-power supply section, and said sub-power section is provided with stopping means for receiving a detection signal from said detection means so as to stop the driving.

69. The voltage converter according to claim 68, wherein said stopping means is composed of the piezo-electric relay which is driven by the raised output voltage of said main power supply section.

70. The voltage converter according to claim 62, comprising a sub-power supply section having the piezo-electric relays which can be driven by the input voltage and a main power supply section having the piezo-electric relays which can be driven by the output voltage.

71. The voltage converter according to claim 70, wherein said sub-power supply section is first operated so as to generate a raised output voltage, and said main power supply section starts to operate.

72. The voltage converter according to claim 71, wherein detection means for detecting the start of operation of said main power supply section is provided to said sub-power supply section, and said sub-power supply section is provided with stopping means for receiving a detection signal from said detection means so as to stop the driving.

73. The voltage converter according to claim 72, wherein said stopping means is composed of the piezo-electric relay which is driven by the raised output voltage of said main power supply section.

74. The voltage converter according to claim 64, comprising a sub-power supply section having the piezo-electric relays which can be driven by the input voltage and a main power supply section having the piezo-electric relays which can be driven by the input voltage and a main power supply section having the piezo-electric relays which can be driven by the output voltage.

75. The voltage converter according to claim 74, wherein said sub-power supply section is first operated so as to generate a raised output voltage, and said main power supply section starts to operate.

76. The voltage converter according to claim 75, wherein detection means for detecting the start of operation of said main power supply section is provided to said sub-power supply section, and said sub-power supply section is provided with stopping means for receiving a detection signal from said detection means so as to stop the driving.

77. The voltage converter according to claim 76, wherein said stopping means is composed of the piezo-electric relay which is driven by the raised output voltage of said main power supply section.

78. The voltage converter according to claim 63, which is of a step-up type that a DC voltage on the output side is larger than an input voltage.

79. The voltage converter according to claim 78, comprising a sub-power supply section having the piezo-electric relays which can be driven by the input voltage and a main power supply section having the piezo-electric relays which can be driven by the output voltage.

80. The voltage converter according to claim 79, wherein said sub-power supply section is first operated so as to generate a raised output voltage, and said main power supply section starts to operate.

81. The voltage converter according to claim 80, wherein detection means for detecting the start of operation of said main power supply section is provided to said sub-power supply section, and said sub-power supply section is provided with stopping means for receiving a detection signal from said detection means so as to stop the driving.

82. The voltage converter according to claim 81, wherein said stopping means is composed of the piezo-electric relay which is driven by the raised output voltage of said main power supply section.

83. The voltage converter according to claim 63, comprising a sub-power supply section having the piezo-electric relays which can be driven by the input voltage and a main power supply section having the piezo-electric relays which can be driven by the output voltage.

84. The voltage converter according to claim 83, wherein said sub-power supply section is first operated so as to generate a raised output voltage, and said main power supply section starts to operate.

85. The voltage converter according to claim 84, wherein detection means for detecting the start of operation of said main power supply section is provided to said sub-power supply section, and said sub-power supply section is provided with stopping means for receiving a detection signal from said detection means so as to stop the driving.

86. The voltage converter according to claim 85, wherein said stopping means is composed of the piezo-electric relay which is driven by the raised output voltage of said main power supply section.

87. The voltage converter according to claim 2, comprising the piezo-electric relays which can be driven by an input voltage.

88. The voltage converter according to claim 87, wherein a groove is provided on the substrate between adjacent operating sections.

89. The voltage converter according to claim 88, which is of a stop-up type that a DC voltage on the output side is larger than an input voltage.

90. The voltage converter according to claim 89, comprising a sub-power supply section having the piezo-electric relays which can be driven by the input voltage and a main power supply section having the piezo-electric relays which can be driven by the output voltage.

91. The voltage converter according to claim 90, wherein said sub-power supply section is first operated so as to generate a raised output voltage, and said main power supply section starts to operate.

92. The voltage converter according to claim 91, wherein detection means for detecting the start of operation of said main power supply section is provided to said sub-power supply section, and said sub-power supply section is provided with stopping means for receiving a detection signal from said detection means so as to stop the driving.

93. The voltage converter according to claim 92, wherein said stopping means is composed of the piezo-electric relay which driven by the raised output voltage of said main power supply section.

94. The voltage converter according to claim 88, comprising a sub-power supply section having the piezo-electric relays which can be driven by the input voltage and a main power supply section having the piezo-electric relays which can be driven by the output voltage.

95. The voltage converter according to claim 94, wherein said sub-power supply section is first operated so as to generate a raised output voltage, and said main power supply section starts to operate.

96. The voltage converter according to claim 95, wherein detection means for detecting the start of operation of said main power supply section is provided to said sub-power supply section, and said sub-power supply section is provided with stopping means for receiving a detection signal from said detection means so as to stop the driving.

97. The voltage converter according to claim 96, wherein said stopping means is composed of the piezo-electric relay which is driven by the raised output voltage of said main power supply section.

98. The voltage converter according to claim 87, which is of a step-up type that a DC voltage on the output side is larger than an input voltage.

99. The voltage converter according to claim 98, comprising a sub-power supply section having the piezo-electric relays which can be driven by the input voltage and a main power supply section having the piezo-electric relays which can be driven by the output voltage.

100. The voltage converter according to claim 99, wherein said sub-power supply section is first operated so as to generate a raised output voltage, and said main power supply section starts to operate.

101. The voltage converter according to claim 100, wherein detection means for detecting the start of operation of said main power supply section is provided to said sub-power supply section, and said sub-power supply section is provided with stopping means for receiving a detection signal from said detection means so as to stop the driving.

102. The voltage converter according to claim 101, wherein said stopping means is composed of the piezo-electric relay which is driven by the raised output voltage of said main power supply section.

103. The voltage converter according to claim 87, comprising a sub-power supply section having the piezo-electric relays which can be driven by the input voltage and a main power supply section having the piezo-electric relays which can be driven by the output voltage.

104. The voltage converter according to claim 103, wherein said sub-power supply section is first operated so as to generate a raised output voltage, and said main power supply section starts to operate.

105. The voltage converter according to claim 104, wherein detection means for detecting the start of operation of said main power supply section is provided to said sub-power supply section, and said sub-power supply section is provided with stopping means for receiving a detection signal from said detection means so as to stop the driving.

106. The voltage converter according to claim 105, wherein said stopping means is composed of the piezo-electric relay which is driven by the raised output voltage of said main power supply section.

107. The voltage converter according to claim 2, comprising a sub-power supply section having the piezo-electric relays which can be driven by the input voltage and a main power supply section having the piezo-electric relays which can be driven by the output voltage.

108. The voltage converter according to claim 107, wherein said sub-power supply section is first operated so as to generate a raised output voltage, and said main power supply section starts to operate.

109. The voltage converter according to claim 108, wherein detection means for detecting the start of operation of said main power supply section is provided to said sub-power supply section, and said sub-power supply section is provided with stopping means for receiving a detection signal from said detection means so as to stop the driving.

110. The voltage converter according to claim 109, wherein said stopping means is composed of the piezo-electric relay which is driven by the raised output voltage of said main power supply section.

111. The voltage converter according to claim 3, wherein one switch element is composed of a plurality of piezo-electric relays, and when said piezo-electric relays perform on/off operations simultaneously, the switch elements are opened and closed.

112. The voltage converter according to claim 111, comprising the piezo-electric relays which can be driven by an input voltage.

113. The voltage converter according to claim 112, wherein a groove is provided on the substrate between adjacent operating sections.

114. The voltage converter according to claim 113, which is of a step-up type that a DC voltage on the output side is larger than an input voltage.

115. The voltage converter according to claim 112, which is of a step-up type that a DC voltage on the output side is larger than an input voltage.

116. The voltage according to claim 3, comprising the piezo-electric relays which can be driven by an input voltage.

117. The voltage converter according to claim 116, wherein a groove is provided on the substrate between adjacent operation sections.

118. The voltage converter according to claim 117, which is of a step-up type that a DC voltage on the output side is larger than an input voltage.

119. The voltage converter according to claim 116, which is of a step-up type that a DC voltage on the output side is larger than an input voltage.

120. The voltage converter according to claim 3, comprising a sub-power supply section having the piezo-electric relays which can be driven by the input voltage and a main power supply section having the piezo-electric relays which can be driven by the output voltage.

121. The voltage converter according to claim 4, comprising the piezo-electric relays which can be driven by an input voltage.

122. The voltage converter according to claim 121, wherein a groove is provided on the substrate between adjacent operating sections.

123. The voltage converter according to claim 122, which is of a step-up type that a DC voltage on the output side is larger than an input voltage.

124. The voltage converter according to claim 121, which is of a step-up type that a DC voltage on the output side is larger than an input voltage.

125. The voltage converter according to claim 4, comprising a sub-power supply section having the piezo-electric relays which can be driven by the input voltage and a main power supply section having the piezo-electric relays which can be driven by the output voltage.

126. The voltage converter according to claim 6, which is of a step-up type that a DC voltage on the output side is larger than an input voltage.

* * * * *

UNITED STATES PATENT AND TRADEMARK OFFICE
CERTIFICATE OF CORRECTION

PATENT NO. : 6,549,437 B1
DATED : April 15, 2003
INVENTOR(S) : Yukihisa Takeuchi and Iwao Ohwada It is certified that error appears in the above-identified patent and that said Letters Patent is hereby corrected as shown below:

<u>Title page,</u>
Item [57], ABSTRACT,
Line 6, please change "surfaced" to -- surfaces --.

Signed and Sealed this

Tenth Day of June, 2003

JAMES E. ROGAN
*Director of the United States Patent and Trademark Office*